United States Patent
Hill et al.

(10) Patent No.: US 6,489,768 B1
(45) Date of Patent: Dec. 3, 2002

(54) SUPERCONDUCTIVE NETWORKS TO OPTIMIZE MULTIPLY TUNED NMR COILS

(75) Inventors: Howard David Wilson Hill, Cupertino; Luiz Felipe Fuks, Fremont, both of CA (US)

(73) Assignees: Varian, Inc., Palo Alto, CA (US); Bruker Biospin Corp., Billerica, MA (US)

(*) Notice: Subject to any disclaimer, the term of this patent is extended or adjusted under 35 U.S.C. 154(b) by 0 days.

(21) Appl. No.: 09/695,147

(22) Filed: Oct. 23, 2000

(51) Int. Cl.[7] .................................. G01V 3/00
(52) U.S. Cl. .................... 324/318; 324/309; 324/322
(58) Field of Search ........................ 324/322, 309, 324/307, 312, 310, 318; 128/653

(56) References Cited

U.S. PATENT DOCUMENTS

| | | | |
|---|---|---|---|
| 3,764,892 A | 10/1973 | Rollwitz | 324/0.5 R |
| 4,833,412 A | 5/1989 | Zens | 324/322 |
| 5,051,700 A | 9/1991 | Fox | 324/322 |
| 5,585,723 A | * 12/1996 | Withers | 324/318 |
| 5,594,342 A | * 1/1997 | Brey et al. | 324/322 |

FOREIGN PATENT DOCUMENTS

| | | |
|---|---|---|
| WO | WO 98/25163 A1 | 6/1998 |
| WO | WO 98/24844 A1 | 5/1999 |

OTHER PUBLICATIONS

Article by Styles, et al., entitled "A High–Resolution NMR Probe in Which the Coil and Preamplifier are Cooled with Liquid Helium", published in *Journal of Magnetic Resonance*, vol. 60, pp. 397–404 (1984).

Article by Black, et al., entitled "A High–Temperature Superconducting Receiver for Nuclear Magnetic Resonance Microscopy", published in *Science*, vol. 259 pp. 793–795, Feb. 5, 1993.

Article by Howard D.W. Hill, "Improved Sensitivity of NMR Spectroscopy Probes by use of High–Temperature Superconductive Detection Coils", published in *IEEE Transactions on Applied Superconductivity*, vol. 7, pp. 3750–3755 (1997).

Article by Anderson, et al., entitled "High–Sensitivity NMR Spectroscopy Probe Using Superconductive Coils", published in *Bull. Magn. Reson.*, vol. 17, pp. 98–102 (1995).

* cited by examiner

*Primary Examiner*—Edward Lefkowitz
*Assistant Examiner*—Brij B. Shrivastav
(74) *Attorney, Agent, or Firm*—Edward H. Berkowitz

(57) ABSTRACT

A double tuned probe for employment in NMR apparatus includes a first resonant circuit of normal phase conductor coupled to the sample and also in communication with a second circuit containing a component in a superconductive phase. Communication between the two circuits supports two RF channels which may be exhibit relative sensitivities in proportion to their relative Q values.

7 Claims, 2 Drawing Sheets

SUPERCONDUCTIVE NETWORKS TO OPTIMIZE MULTIPLY TUNED NMR COILS

FIELD OF THE INVENTION

The invention is in the field of nuclear magnetic resonance (NMR) and particularly relates to NMR probes having superconducting components.

BACKGROUND OF THE INVENTION

NMR data are among the most precise characterizations of the chemical structure of matter, being based upon time/frequency measurements. The sensitivity, R, of an NMR instrument is limited by the relationship of the signal amplitude to the noise in the signal channel. Where the noise is treated as the rms value of the observed noise level, the sensitivity may be expressed as $$R = S/(2N_{rms})$$

and $S/N_{rms}$, the signal to noise parameter can be shown to be directly proportional to the square root of the quality factor, Q, of the receiver probe coil and inversely proportional to the square root of the temperature characterizing the probe coil resistance.

Thermal adjustment of the RF circuit of an NMR probe has been known for a number of years. NMR probe sensitivity is significantly enhanced by reduction of thermal noise by cooling of normal metal NMR coils as demonstrated by Styles, et al, J. Mag. Res. v. 60, 397 (1984) to yield a sensitivity gain of about a factor of three compared with a conventional probe. Rollwitz, U.S. Pat. No. 3,764,892, proposed a superconducting NMR coil, but this apparatus was not reduced to practice. Black, et al describe an NMR imaging probe using high temperature superconducting (HTS) materials. The application of these materials to high resolution NMR has been described by Hill, IEEE Trans. Appl. Superconductivity, v.7, p. 3750 (1997) and by Anderson, et al, Bull. Magn. Reson., v17, p.98 (1995).

The sensitivity of an NMR probe for fixed sample volume is also proportional to η, the filling factor, for the coil. Thus, one may manipulate η, Q and T to improve sensitivity. In particular, superconducting coils may achieve a Q of the order of $10^4$ compared to values less than $10^2$ for conventional coils. In addition, superconducting coils operate at temperatures of about 30° K. compared to 300° K. Thermal control of the NMR probe coil necessitates provision for thermal isolation between the coil and the object under study. As a consequence, the filling factor for the coil is diminished. With allowance for loss in filling factor appropriate to a typical 5 mm sample tube, sensitivity enhancement of an order of magnitude is achievable in respect to the conventional NMR probe. Clearly, a coil operating at room temperature facilitates maximization of filling factor.

The transmit (excitation) pulse of an analytic NMR instrument must produce an RF field of sufficient magnitude to excite all resonances in the frequency range under study. It is often desirable to produce and/or detect resonance conditions concurrently in different nuclei and this function is accommodated in an RF probe circuit capable of supporting resonance at multiple frequencies. Such multi-resonant RF probes are well known in the art. Generally, such a probe circuit supports two separate RF channels, each independently tunable where the two channels incorporate a common inductance coupled to the sample. One practical attribute of multi-resonant circuits is that the sensitivity in either channel is rather less than might be achieved in a corresponding singly resonant probe circuit. Moreover, in a multiply resonant circuit, the sensitivity can only be optimized at a one of the resonant frequencies while the remaining resonance(s) result in circuit sensitivities(s) significantly less than the circuit sensitivity for that one resonance. Accordingly, it would be desirable to increase the sensitivities of each RF channel of a multi-resonant NMR probe to approach the sensitivity achievable for corresponding singly resonant probe circuits.

In the prior art, a balanced dual resonant circuit is known wherein the high Q value properties of coaxial transmission lines is exploited to effectuate trap inductances. See U.S. Pat. No. 4,833,412, commonly assigned herewith.

SUMMARY OF THE INVENTION

An object for the present invention is the achievement of a multiply resonant NMR probe circuit wherein the sensitivity of the RF channels more closely approaches the sensitivity characterizing an equivalent singly tuned circuit for any such channel.

Further and additional advantages and objectives of the invention will be set forth in the description which follows, and in part will be apparent from practice of the invention.

The objectives are achieved in a mutliply tuned circuit which is realized from a first resonant circuit which couples to the object under study (typically via inductive component, or sample coil surrounding said object) and which first circuit communicates with at least one other resonant circuit (including a trap coil) which is remote from the object, and thus from the inductive component of the first circuit. Each of these first and other circuits supports an RF channel for communication to either a corresponding RF source or for the processing of a resonant signal developed in the respective circuit. The two resonant circuits preferably communicate through simple series connection whereby the RF channel which is directed to the other, or trap circuit (usually a low frequency channel) encounters a series connection to ground. The higher frequency RF channel is directed in parallel to the two resonant circuits. As described this multiple tuned circuit is conventional. However, as shown below, the sensitivity is relatively degraded for the two RF channels as a function of the ratio of the Q values for the respective inductive components. If the trap coil and/or components of this resonant circuit (which is remote from the object of study) incorporates superconductor in the superconducting phase, the corresponding Q value becomes very large, e.g. of order $10^3$ to $10^4$, whereas the non-superconductive resonant circuit coupled to the object retains a Q value of the order $10^2$. The sensitivity of the respective RF channels may be adjusted to more nearly correspond to the sensitivity of independent singly tuned resonant circuits by the employment of superconductor in only one sub-circuit of the dual resonant circuit.

Figure 1:
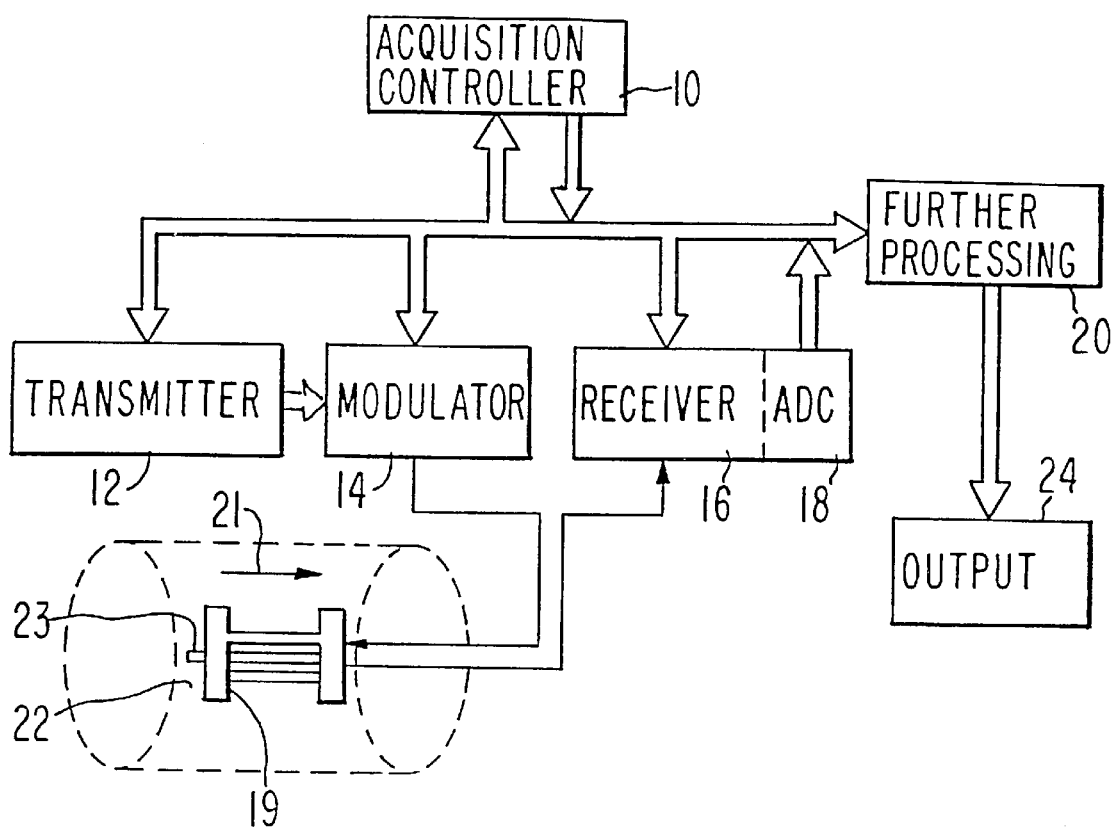
FIG. 1 is a schematical representation of an NMR system.

While the invention is susceptible to various modifications and alternative forms, the above figures are presented by way of example and/or for assistance to understanding the structure or phenomena. It should be understood, however, that the description herein of the specific embodiments is not intended to limit the invention to the particular forms disclosed, but rather, the intention is to cover all modifications, equivalents, and alternatives falling within the spirit and scope of the invention as defined in the appended claims.

DETAILED DESCRIPTION OF THE INVENTION

The context of the invention is best appreciated from the generalized NMR system of figure where there is shown a typical NMR instrument forming the environment for the operation of the present invention. An acquisition/control processor 10 communicates with an RF transmitter 12, modulator 14 and receiver 16, including analog-to-digital converter 18 and a further digital processor 20. The modulated RF power irradiates an object 23 in a polarizing magnetic field 21 through a probe assembly 22 and response of the object is intercepted by probe assembly 22 communicating with receiver 16. The response typically takes the form of a transient time domain waveform or free induction decay. This transient waveform is sampled at regular intervals and samples are digitized in ADC 18. The digitized time domain wave form is then subject to further processing in processor 20. The nature of such processing may include averaging the time domain waveform over a number of similar of such waveforms and transformation of the average time domain wave form to the frequency domain yields a spectral distribution function directed to output device 24. Alternatively this procedure may thus be repeated with variation of some other parameter and the transformation(s) from the data set may take on any of a number of identities for display or further analysis.

The magnetic field 21 is directed parallel to the z axis, which polarizes the sample and defines the Larmor frequency thereof, is established by an appropriate means, not shown. Coil(s) 19 are employed for imposing a desired spatial and time dependence of magnetic field.

Figure 2:
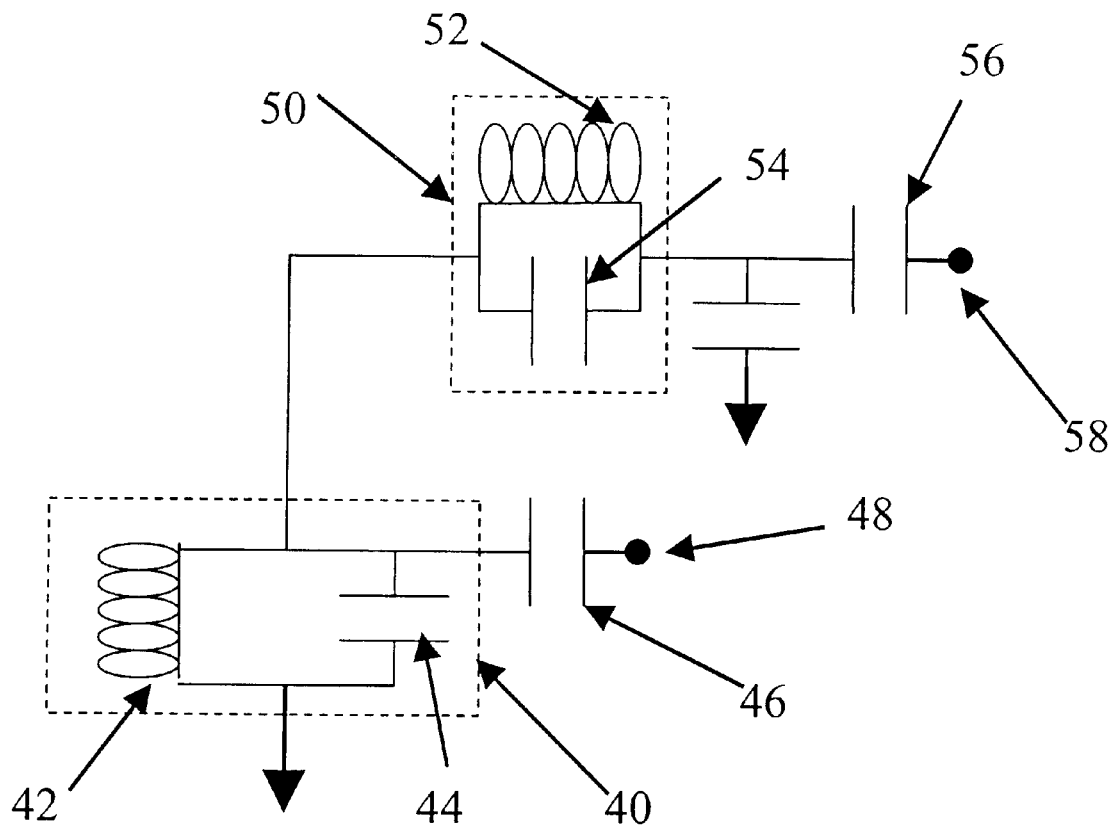
FIG. 2 is a representative type of dual resonant circuit for the present invention.

Turning now to FIG. 2 there is shown a typical double resonant circuit for NMR use. First resonant circuit 40 is in series with second resonant circuit 50. First RF channel 48 is in parallel communication with both resonant circuits 40 and 50. Second RF channel 58 is in series with the serial combination of resonant circuits 40 and 50. The RF channels are capacitively coupled through the respective capacitors 46 and 56 to the double resonant combination.

Reference here is to an RF channel because in common NMR usage, both the RF excitation from an RF source is coupled to the object disposed within inductor 42 and the RF signal emanating from the object within inductor 42 are present, albeit, not concurrently. A second RF channel is identified with the resonant circuit 50 comprising inductor 52. Each channel may be characterized by a sensitivity parameter. Because each channel is coupled to the other, the sensitivity of each channel is affected by the presence of the components comprising the other channel. It has been shown by Hoult, Progress in Nuclear Spectroscopy, v. 12, P. 41 (1978) that the sensitivities of each of the two channels is reduced by a factor $\rho$, such that $$\rho_{50}=[1+(Q_{42}/Q_{52})(L_{52}/L_{42})]^{-\frac{1}{2}} \quad \text{Equ. 1}$$

$$\rho_{40}=[1+(Q_{42}/Q_{52})(L_{42}/L_{52})]^{-\frac{1}{2}} \quad \text{Equ. 2}$$

where $Q_x$ is the Q of the corresponding coil and $L_x$ is the inductance, including mutual inductance, associated with that coil. It is observed that in conventional practice, $Q_{42} \cong Q_{52}$ (both conventional coils) and that for, $L_{42}$ tuned to the higher frequency resonance, $L_{42} \ll (L_{52}+L_{42})$. Thus $\rho_{40} \ll 1$ while $\rho_{50} \cong 1$. For the case where $L_{42}=L_{52}$, one obtains a sensitivity reduction factor $\rho \cong 1/\sqrt{2}$ with the result that the sensitivity of each channel is reduced to approximately 70% of the sensitivity of the singly tuned circuit.

In the present invention the inductor 42 comprises a conventional (non-superconducting state) conductor with a conventional Q value. (This coil may be cooled to enhance the S/N parameter, but is in all respects a conventional coil). The inductor 52 is a superconducting coil located relatively remote from the inductor 42 and consequently the resonant circuit 50 may be characterized with a high Q (of order $10^4$ where the resonant circuit 40 is characterized by a Q value of the order $10^2$ at room temperature or $10^3$ when cooled to substantially below ambient. As a result, the ratio $Q_{42}/Q_{52}$ is manipulated to be very small compared to 1, while the values of corresponding inductances are capable of selection independently to optimize the resonant properties of the respective circuits.

The utility of the invention is separately recognized in that normal conductors are not so limited in power handling capability as are superconductors. It is also a consideration that the sample coil in an NMR probe must be carefully matched in susceptibilty to the ambient susceptibility to eliminate or minimize magnetic in homogenieties. Conventional susceptibilty matching is quite often achieved by specific alloying practice or by inclusion of diverse conductors to form a hybrid conductor, none of which lends itself to the use of superconductors. In another aspect, the filling factor for an NMR sample coil comprising superconductor material is often limited in the geometry that can be achieved with such coils, which are most often formed on planar substrates. In addition, a superconducting coil must incorporate thermal isolation with a consequent loss in filing factor. Thus the use of a normal metal conductor in the sample space addresses the above whereas the inclusion of the superconductive coil external to the sample space provides the benefits of the very high relative Q for such purposes as the double resonant circuit described herein. Moreover, the superconducting coil is disposed remotely from the sample coil: the filling factor of the sample coil is not adversely affected by the need for insulation jacketing.

The use of a superconductor in a probe has a perturbing effect on the homogeneity of the polarizing magnetic field 21. However, the perturbation due to a remote trap coil as described herein, is more easily controlled then that due to a superconductive receiver coil of the prior art. As a result, there is more freedom to choose different types of superconductive materials, current carrying capacity, etc.

The above described circuit is only exemplary in nature. It is straightforward to substitute inductive, or transformer coupling between sub-circuits of a multi-resonant circuit. Series resonant arrangements may be employed rather than the parallel resonant sub-circuits of FIG. 2.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR probe comprising
   a first resonant circuit comprising a first inductance, a first resonant capacitance and first coupling capacitor, said first resonant circuit coupled to an object for study via NMR measurement,
   a second circuit remotely disposed from said sample, said second circuit comprising a second inductance, a second capacitance and second coupling capacitor, said second circuit being independently tunable in respect to said first resonant circuit, first and second resonant circuits in parallel communication in respect to a first RF channel and in serial communication in respect to a second RF channel, said second circuit comprises a superconducting component in a superconducting phase.

2. The NMR probe of claim 1 wherein said first resonant circuit comprises components in normal phase conductor.

3. The NMR probe of claim 2 wherein said second circuit is disposed to reduce substantial coupling with said object.

4. The NMR probe of claim 1 wherein said parallel communication between first resonant circuit and said second circuits comprises a superconducting conductor therebetween.

5. The NMR probe of claim 1 wherein said second resonant circuit comprises a capacitor, said capacitor comprising at least two conducting surfaces arranged on opposite sides of a dielectric, wherein said conducting surfaces are in a superconducting phase.

6. In an NMR probe comprising a first resonant circuit coupled to both an object for study and a second resonant circuit in communication with a first RF channel and said first and second resonant circuits in communication in respect to a second RF channel, said second resonant circuit remotely disposed from said sample, said second resonant circuit being independently tunable in respect to said first resonant circuit and said second circuit comprising a superconducting component, the method of selectively adjusting the relative sensitivity for said first and second channels comprising, adjusting the quality factor of said second resonant circuit in respect to the quality factor of said first resonant circuit by operating said second resonant circuit in the superconducting phase of said component while operating said first resonant circuit in the normal phase thereof.

7. An NMR system for the investigation of an object, said system comprising, a polarizing magnet, an RF source for excitation of resonance within said object, an RF receiver for the detection of resonance within said object, and a probe for coupling said object to said RF source and to said RF receiver, said probe comprising a first resonant circuit comprising a first inductance, a first resonant capacitance and first coupling capacitor, said first resonant circuit coupled to an object for study via NMR measurement, a second circuit remotely disposed from said sample, said second circuit comprising a second inductance, a second capacitance and second coupling capacitor, said second circuit being independently tunable in respect to said first resonant circuit, first and second resonant circuits in parallel communication in respect to a first RF channel and in serial communication in respect to a second RF channel, said second circuit comprising a superconducting component in a superconducting phase.

* * * * *